United States Patent
Shabbir et al.

(10) Patent No.: US 10,296,060 B2
(45) Date of Patent: May 21, 2019

(54) SYSTEMS AND METHODS FOR AUTOMATED CONFIGURATION RESTRICTIONS AND COMPLIANCE OF TEMPERATURE

(71) Applicant: Dell Products L.P., Round Rock, TX (US)

(72) Inventors: Hasnain Shabbir, Round Rock, TX (US); Dominick A. Lovicott, Jarrell, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/607,201

(22) Filed: May 26, 2017

(65) Prior Publication Data
US 2018/0341302 A1    Nov. 29, 2018

(51) Int. Cl.
*H01L 23/427*  (2006.01)
*H05K 7/20*   (2006.01)
*G06F 1/20*   (2006.01)

(52) U.S. Cl.
CPC .......... *G06F 1/206* (2013.01); *H01L 23/427* (2013.01); *H05K 7/20836* (2013.01); *F28F 2250/08* (2013.01)

(58) Field of Classification Search
CPC ....... H01L 23/427; H01L 23/34; G06F 1/206; G06F 1/3203; G06F 1/20; G06F 1/26; G06F 1/203; G06F 1/3206; H05K 7/20836; H05K 7/207; H05K 7/20781; H05K 7/20809; F28F 2250/08
See application file for complete search history.

(56) References Cited

U.S. PATENT DOCUMENTS

| | | | | |
|---|---|---|---|---|
| 9,158,311 | B2* | 10/2015 | Geissler | G05D 23/1932 |
| 2002/0194509 | A1* | 12/2002 | Plante | G06F 1/206 713/300 |
| 2004/0165358 | A1* | 8/2004 | Regimbal | H05K 7/1498 361/727 |
| 2005/0030171 | A1* | 2/2005 | Liu | G06F 1/206 340/500 |
| 2006/0197740 | A1* | 9/2006 | Xu | G06F 1/206 345/156 |
| 2006/0259621 | A1* | 11/2006 | Ranganathan | G06F 1/206 709/226 |
| 2009/0265568 | A1* | 10/2009 | Jackson | G06F 1/3203 713/320 |
| 2010/0170277 | A1* | 7/2010 | Schmitt | H05K 7/20745 62/259.2 |

(Continued)

*Primary Examiner* — Adam B Dravininkas
(74) *Attorney, Agent, or Firm* — Jackson Walker L.L.P.

(57) ABSTRACT

In accordance with embodiments of the present disclosure, a system may include a cooling subsystem comprising at least one air mover configured to generate a cooling airflow in the system and a thermal manager communicatively coupled to the cooling subsystem for control of the cooling subsystem and configured to: (i) determine relevant temperature limits of each of a plurality of hardware configurations, the hardware configuration based on a hardware inventory of the system; (ii) determine the lowest temperature limit of the relevant temperature limits; and (iii) responsive to a determination that a real-time temperature is above the lowest temperature limit, take remedial action.

16 Claims, 11 Drawing Sheets

(56) References Cited

U.S. PATENT DOCUMENTS

2012/0120603 A1* 5/2012 Campbell .......... H05K 7/20781
361/698
2014/0052429 A1* 2/2014 Kelkar .................. G06F 3/0625
703/13

* cited by examiner

ENERGY BALANCE TABLE

| ENERGY BALANCE NUMBER | DESCRIPTION | CONFIGURATION MATCH | PWM TO? (CFM/LFM) | EXHAUST SENSOR? (T_EXHAUST OR PCIe_INLET) | CROSS-SECTIONAL AREA FOR LFM CALCULATION [IN FT²] | SYSTEM AIRFLOW AND EXHAUST REPORTING |
|---|---|---|---|---|---|---|
| EB1 | REPORT SYSTEM AIRFLOW - 24 DRIVE NP | 1,2,3,4 | CFM | T_EXHAUST | | X |
| EB2 | REPORT SYSTEM AIRFLOW - 12 DRIVE NP | 5,6,7 | CFM | T_EXHAUST | | X |
| EB3 | X4 PCI COOLING | 15 | LFM | T_EXHAUST | 0.133 | |
| EB4 | X8 PCI COOLING | 16 | LFM | T_EXHAUST | 0.133 | |
| ○○○ | ○○○ | ○○○ | ○○○ | ○○○ | ○○○ | ○○○ |

FIG. 4

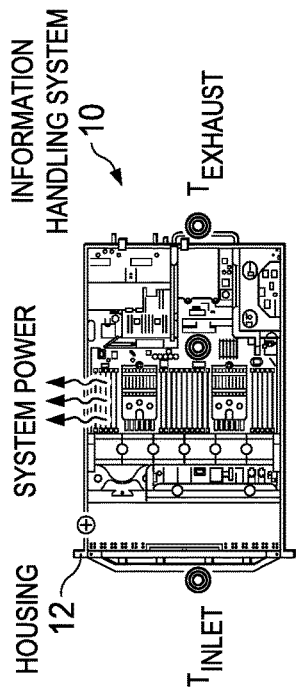

FIG. 5A

EXHAUST TEMPERATURE ENERGY BALANCE $T\_exhaust = (1.76 \times POWER/CFM) + T_{INLET}$ $CFM_{BASE} = A \times PWM^4 + B \times PWM^3 + C \times PWM^2 + D \times PWM + E$ $CFM = CFM_{BASE} \times (1 + SCALING\ FACTOR \times COMPONENT\ COUNT) \times ...$ $POWER = \sum_{n=0}^{n} POWER \times SCALING\ FACTOR + ... + P_{static}$ n : iDRAC ITERATION

| ENERGY BALANCE NUMBER | | | | | | | | | | | | | |
|---|---|---|---|---|---|---|---|---|---|---|---|---|---|
| | STATIC POWER VALUE | SCALING FACTORS | 0 | AVERAGE NUMBER OF READINGS | N | A | B | C | D | E | FAN COUNT | SCALING FACTORS | 0 | $T_{AMBIENT}$ |

Table (combined):

| ENERGY BALANCE NUMBER | | | | | | | | | | | |
|---|---|---|---|---|---|---|---|---|---|---|---|
| | | | | | | | | | | | SENSOR NAME |
| | STATIC POWER VALUE | SCALING FACTORS | 0 | | | | | | | | MEMORY COUNT |
| | PCI SUBSYSTEM | | 0 | | | | | | | | CPU COUNT |
| | STORAGE SUBSYSTEM | | 0 | | | | | | | | PCIe COUNT |
| | CPU SUBSYSTEM | | 0 | | | | | | | | HDD COUNT |
| | TOTAL SYSTEM | | 1 | | | | | | | | FAN COUNT |
| | AVERAGE NUMBER OF READINGS | N | 60 | A | B | C | D | E | | | |
| | | | | 0 | 0 | 0 | 0.9 | 10 | | | SCALING FACTORS |
| EB1 | | | | | | | | | | | $T_{AMBIENT}$ |

PWM-TO-CFM CORRELATION: A=0, B=0, C=0, D=0.9, E=10

Scaling factors column: MEMORY COUNT 0, CPU COUNT 0, PCIe COUNT 0, HDD COUNT -0.008, FAN COUNT 0

53 — LFM CORRELATIONS ARE DEFINED HERE AND ARE BASED ON WORST CASE SLOT LFM. THE CALCULATED LFM FROM HERE IS THEN TRANSLATED TO PER-SLOT LFM BASED ON PER-SLOT SCALING FACTORS

LFM $LFM = LFM_{BASE} \times (1 + SF \times COMPONENTCOUNT) \times ...$ $LFM_{BASE} = A \times PWM^5 + B \times PWM^4 + C \times PWM^3 + D \times PWM^2 + E \times PWM + F$

FAN SPEED (% PWM) IS AN AVERAGE OF ALL FAN ZONES

| | | SCALING FACTORS (SF) | |
|---|---|---|---|
| MEMORY COUNT | | | 0 |
| CPU COUNT | | | 0 |
| PCIe COUNT | | | 0 |
| HDD COUNT | | | -0.006 |
| FAN COUNT | | | 0 |
| LOWER LFM LIMIT | UCL | | |
| LOWER LFM LIMIT | LCL | | |

PWM-TO-CFM CORRELATION (5TH ORDER POLYNOMIAL)

| A | B | C | D | E | F |
|---|---|---|---|---|---|
| | | | 8.3 | 154 | 11 |

FIG. 5B

| GLOBAL COMPONENT COMPLIANCE | | |
|---|---|---|
| | 1.8 FRESH AIR COMPLIANCE | YES/NO |
| | THIS PLATFORM? | YES |
| IF ANY OF THIS CONDITION IS MATCHED | PCIeSSD/NVME DRIVES PRESENT | NO |
| | NVDiMMs AND BATTERY PRESENT | NO |
| | APACHE PASS DIMMs PRESENT | NO |
| | 1.8" SSDs PRESENT | NO |
| | PCIe CARDS - WITH AUX CABLE DETECTED | NO |
| | M.2/BOSS PRESENT | YES |
| | LRDIMM DETECTED | YES |
| | TBU PRESENT | NO |
| | UNMATCHED PCIe CARDS FOUND | NO |
| | NON-REDUNDANT PSU CONFIG FOUND | NO |
| | MID-DRIVE CONFIG | NO |
| | REAR-DRIVE CONFIG | NO |
| | CPU TDP LIMIT FOR FA COMPLIANCE | 160 |

FIG. 10

SYSTEMS AND METHODS FOR AUTOMATED CONFIGURATION RESTRICTIONS AND COMPLIANCE OF TEMPERATURE

TECHNICAL FIELD

The present disclosure relates in general to information handling systems, and more particularly to thermal management of an information handling system and determining thermal configuration restrictions and compliance in an automated fashion.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, thermal management systems including air movers (e.g., cooling fans and blowers) have often been used in information handling systems to cool information handling systems and their components. Various input parameters to a thermal management system, such as measurements from temperature sensors and inventories of information handling system components are often utilized by thermal management systems to control air movers and/or throttle power consumption of components in order to provide adequate cooling of components.

One limitation of existing thermal control systems are that System ambient operating conditions are static and do not change with changes in configuration of an information handling system. Thus, static ambient limit-based warnings often reflect a portfolio standard support, not a customer-specific configuration. Configuration-based limits are often instead defined in source books or user manuals in which a user may access to better understand server thermal boundary conditions. Thus, changes to fan types in monolithic systems are not accounted for in legacy temperature limit definitions, ambient temperature limits, power capping limits, and other parameters may not be updated as more performance and airflow is available.

SUMMARY

In accordance with the teachings of the present disclosure, disadvantages and problems associated with thermal management of an information handling system may be reduced or eliminated.

In accordance with embodiments of the present disclosure, a system may include a cooling subsystem comprising at least one air mover configured to generate a cooling airflow in the system and a thermal manager communicatively coupled to the cooling subsystem for control of the cooling subsystem and configured to: (i) determine relevant temperature limits of each of a plurality of hardware configurations, the hardware configuration based on a hardware inventory of the system; (ii) determine the lowest temperature limit of the relevant temperature limits; and (iii) responsive to a determination that a real-time temperature is above the lowest temperature limit, take remedial action.

In accordance with these and other embodiments of the present disclosure, a method may include determining relevant temperature limits of each of a plurality of hardware configurations of a system, the hardware configuration based on a hardware inventory of the system, determining the lowest temperature limit of the relevant temperature limits, and responsive to a determination that a real-time temperature is above the lowest temperature limit, taking remedial action.

In accordance with these and other embodiments of the present disclosure, a system may include a cooling subsystem comprising at least one air mover configured to generate a cooling airflow in the system and a thermal manager communicatively coupled to the cooling subsystem for control of the cooling subsystem and configured to determine a temperature limit associated with the system and determine whether the system satisfies an environmental standard based on a lowest temperature limit.

In accordance with these and other embodiments of the present disclosure, a method may include determining a temperature limit associated with a system having a cooling subsystem comprising at least one air mover configured to generate a cooling airflow in the system and a thermal manager communicatively coupled to the cooling subsystem for control of the cooling subsystem and determining whether the system satisfies an environmental standard based on a lowest temperature limit.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 4 illustrates a user interface for managing thermal conditions of a server information handling system with stored configuration settings of subsystems within the information handling system, in accordance with embodiments of the present disclosure;

FIGS. 5A and 5B illustrate a user interface for estimating system airflow and exhaust temperature based upon conservation of energy within an information handling system housing, in accordance with embodiments of the present disclosure;

FIG. 10 illustrates an example list of conditions for a component inventory such that satisfaction of at least a defined subset of the listed conditions satisfies a particular environmental standard, in accordance with embodiments of the present disclosure.

DETAILED DESCRIPTION

Preferred embodiments and their advantages are best understood by reference to FIGS. 1 through 10, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
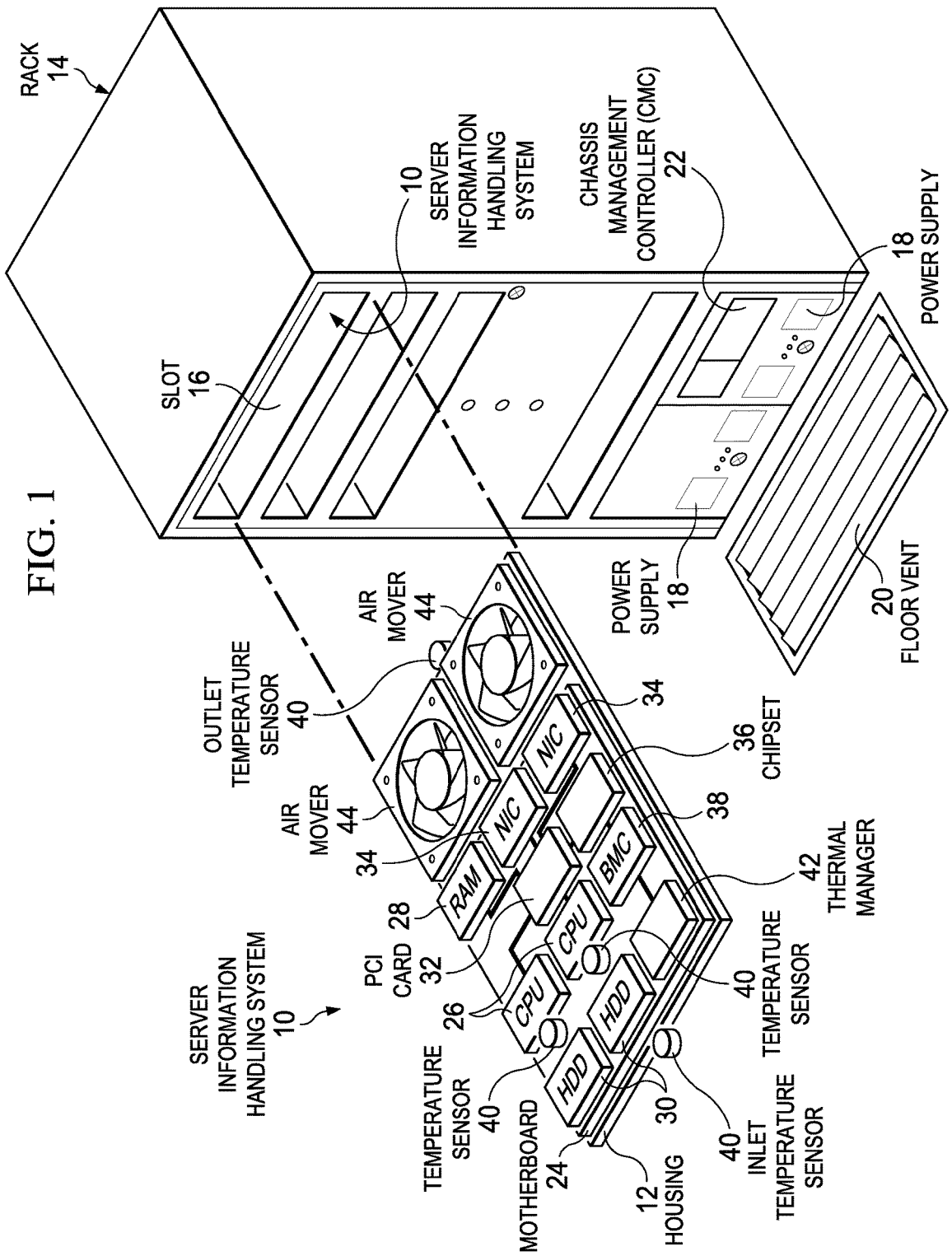
FIG. 1 illustrates a perspective view of an example information handling system, in accordance with embodiments of the present disclosure.

FIG. 1 illustrates a perspective view of an example information handling system 10, in accordance with embodiments of the present disclosure. As shown in FIG. 1, information handling system 10 may comprise a server built into a housing 12 that resides with one or more other information handling systems 10 in a rack 14. Rack 14 may comprise a plurality of vertically-stacked slots 16 that accept information handling systems 10 and a plurality of power supplies 18 that provide electrical energy to information handling systems 10. In a data center environment, rack 14 may receive pretreated cooling air provided from a floor vent 20 to aid removal of thermal energy from information handling systems 10 disposed in rack 14. Power supplies 18 may be assigned power based upon availability at the data center and may allocate power to individual information handling systems 10 under the management of a chassis management controller (CMC) 22. CMC 22 may aid coordination of operating settings so that information handling systems 10 do not exceed thermal or power usage constraints.

Housing 12 may include a motherboard 24 that provides structural support and electrical signal communication for processing components disposed in housing 12 that cooperate to process information. For example, one or more central processing units (CPUs) 26 may execute instructions stored in random access memory (RAM) 28 to process information, such as responses to server requests by client information handling systems remote from information handling system 10. One or more persistent storage devices, such as hard disk drives (HDD) 30 may store information maintained for extended periods and during power off states. A backplane communications manager, such as a PCI card 32, may interface processing components to communicate processed information, such as communications between CPUs 26 and network interface cards (NICs) 34 that are sent through a network, such as a local area network. A chipset 36 may include various processing and firmware resources for coordinating the interactions of processing components, such as a basic input/output system (BIOS). A baseboard management controller (BMC) 38 may interface with chipset 36 to provide out-of-band management functions, such as remote power up, remote power down, firmware updates, and power management. For example, BMC 38 may receive an allocation of power from CMC 22 and monitor operations of the processing components of information handling system 10 to ensure that power consumption does not exceed the allocation. As another example, BMC 38 may receive temperatures sensed by temperature sensors 40 and apply the temperatures to ensure that thermal constraints are not exceeded.

A thermal manager 42 may execute as firmware, software, or other executable code on BMC 38 to manage thermal conditions within housing 12, such as the thermal state at particular processing components or ambient temperatures at discrete locations associated with housing 12. Thermal manager 42 may control the speed at which air movers 44 (e.g., cooling fans or cooling blowers) rotate to adjust a cooling airflow rate in housing 12 so that heat is removed at an appropriate temperature, so as to reduce overheating of a CPU 26 or prevent an excessive exhaust temperature as measured by an outlet temperature sensor 40. In the event that air movers 44 cannot provide sufficient cooling airflow to meet a thermal constraint, thermal manager 42 may reduce power consumption at one or more of the processing components to reduce the amount of thermal energy released into housing 12, such as by throttling the clock speed of one or more of CPUs 26. Thermal manager 42 may respond to extreme thermal conditions that place system integrity in jeopardy by shutting down information handling system 10, such as might happen if floor vent 20 fails to provide treated air due to a data center cooling system failure.

In order to more effectively manage thermal conditions associated with housing 12, thermal manager 42 may apply conservation of energy to estimate thermal conditions at discrete locations associated within housing 12 and then use the estimated thermal conditions for more precise control of the overall thermal state of information handling system 10. For example, thermal manager 42 may perform one or more energy balances based upon available measures of power consumption, cooling fan speed, and sensed thermal conditions to estimate intermediate temperatures at discrete locations within housing 12. The estimated intermediate temperatures may provide more precise control of the thermal conditions at discrete locations to maintain thermal constraints, such as maximum ambient temperatures of components that do not include temperature sensors or maximum inlet temperatures for components downstream in the cooling airflow from the estimated ambient temperature. Estimated intermediate temperatures may be applied in an overall system conservation of energy model so that fan speed and component power consumption are determined to maintain thermal constraints, such as maximum exhaust temperatures. Thermal manager 42 may estimate discrete thermal conditions at locations within housing 12 by applying available component configuration information, such as a component inventory kept by BMC 38, and sensed, known, or estimated power consumption of the components. For example, BMC 38 may use actual power consumption of components or subassemblies if actual power consumption is available, known power consumption stored in the BMC inventory for known components, or estimated power consumption based upon the type of component and the component's own configuration. An example of estimated power consumption is a general estimate of power consumption stored in BMC 38 for unknown PCI cards 32 with the general estimate based upon the width of the PCI card, i.e., the number of links supported by the PCI card. In one embodiment, as estimated intermediate thermal conditions are applied to generate fan and power consumption settings, a self-learning function may compare expected results and models to component and subassembly thermal characteristics so that more accurate estimates are provided over time.

Figure 2:
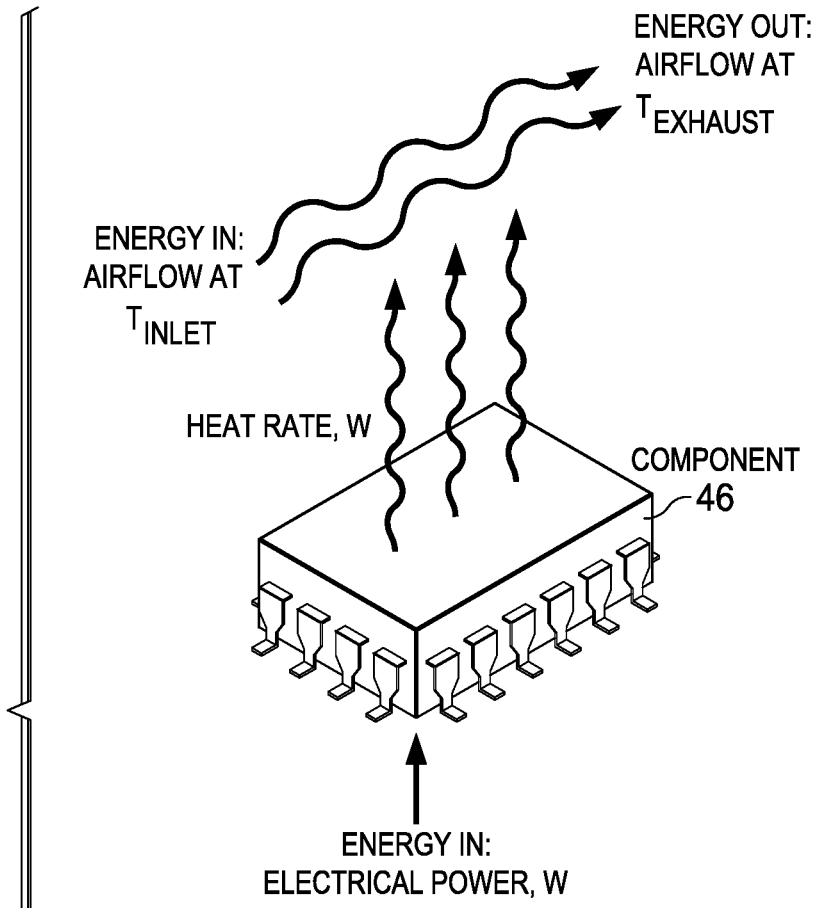
FIG. 2 illustrates a mathematical model for estimating component thermal performance and setting thermal controls, in accordance with embodiments of the present disclosure.

FIG. 2 illustrates a mathematical model for estimating component 46 thermal performance and setting thermal controls, in accordance with embodiments of the present disclosure. According to the law of conservation of energy, the total energy state of an information handling system is maintained as a balance of the energy into the system and the energy out of the system. The energy balance may be broken into a sum of a plurality of components 46 wherein each component 46 has a known or estimated power consumption that introduces thermal energy into the information handling system. The system energy balance becomes the energy into the system as reflected by an airflow inlet temperature, the thermal energy released by the sum of the components 46 that consume power in the system, and the energy out of the system as reflected by an airflow exhaust temperature. Energy removed from the system may relate to the mass flow rate of air flowing through the system and the coefficient for energy absorption of the cooling airflow. Simplified for the coefficient that typically applies to atmospheric air, the energy released by electrical power consumption may be equal to airflow in cubic feet per minute divided by a constant of 1.76 and multiplied by the difference between the exhaust temperature and inlet temperature. Alternatively, again simplified for the coefficient that typically applies to atmospheric air, the energy released by electrical power consumption may be equal to a linear airflow velocity in linear feet per minute (which may be calculated as a cubic airflow rate in cubic feet per minute multiplied by an area of an inlet of a component of interest (e.g., cross sectional area of inlet of a card)) divided by a constant of 1.76 and multiplied by the difference between the exhaust temperature and inlet temperature. Thermal manager 42 may apply one or both of these formulas to set cooling fan speed to meet exhaust temperature constraints. For internal components and subassemblies, thermal manager 42 may determine a minimum fan speed to keep ambient temperature of a component within a desired constraint by determining an "inlet" temperature estimated for air as it arrives at the component based upon power consumption of other components in the airflow before the air arrives at the component of interest. The increase in temperature exhausted at the component of interest may be estimated based upon the power consumed by the component of interest and the cooling airflow rate. Thus, a fan speed may be set that prevents an "exhaust" from the component of interest that is in excess of thermal constraints associated with the component. Alternatively, estimated temperatures at intermediate components may be summed and applied to set a fan speed that achieves a desired overall system thermal condition, such as an exhaust temperature constraint.

Applying conservation of energy and component power consumption to manage thermal conditions may allow more precise control of thermal conditions and discrete control within an information handling system housing even where measurements of actual thermal conditions by a temperature sensor are not available. A modular energy balance thermal controller may allow combined serial energy balances to account for the effect of reduced inlet temperatures when increasing speeds for downstream energy balances. This flexibility may be provided by using energy balances independently to solve for either exhaust temperature or airflow on a system-wide basis or at discrete locations within a system. Subsystem power consumption based upon a component or collection of components may allow for estimation of upstream preheat for other components within an information handling system housing. For example, components that do not dissipate substantial heat by power consumption may be scaled to have a reduced impact on airflow temperatures. One example of such a component is a cooling fan, which dissipates 60 to 80% of power consumption as heat and 20 to 40% as air moving, but is generally ignored with conventional thermal controls. By adding fan power and scaling to match efficiency for the system, a more precise picture of thermal conditions within a housing may be provided. Isolating power consumption of specific regions, subsystems or components of interest, such as PCI cards, may allow the power readings for the subsystems to include static power from non-relevant components that are accounted for by subtracting a static power value. Assigning scaled values that relate heat dissipation and power consumption for each subsystem may provide more exact estimates of thermal conditions and more precise control of airflow and power settings based upon preheat that occurs in the airflow as the airflow passes through the housing. Approaching thermal management based upon a serial summation of subsystem thermal conditions supports the use of static values for selected subsystems to subtract thermal overhead or exclude dynamic readings, such as to control fan speed to achieve a static reading instead of monitoring an available dynamic reading.

Using subsystem thermal condition estimates may aid in achieving more accurate fan speed settings for a desired exhaust constraint since airflow-to-fan speed relationships are set based on actual system configuration and component power consumption. Summed energy balances of discrete subsystems disposed in a housing may differentiate thermal control based on hardware inventory, system state, or system events to enhance control accuracy. Airflow may be scaled to account for component count based upon active components and functions being performed at the components during control time periods. When solving for airflow settings needed to meet a component or system-wide thermal constraint, the inlet or exhaust temperature may generally be a fixed requirement that aligns with a temperature limit so that selectively setting static values allows derivation of control values without using available dynamic values. Dynamically calculated inlet ambient with a fixed static exhaust ambient or a fixed inlet ambient and a dynamically calculated exhaust ambient may provide a better estimate of system airflow. As power use fluctuates, feedback and feed forward control of thermal conditions based on average power consumption may dampen cooling fan setting fluctuations that occur when fan settings are made based upon instantaneous power readings alone. Averaging measured fan speeds may also help to simplify correlations and to "learn" thermal characteristics of subsystems as thermal conditions respond over time to changes in power consumption at various subsystems. For example, each fan within a housing can run at different pulse width modulation (PWM) speed settings in which a speed of a fan is based on a duty cycle of a PWM signal received by the fan. Calculating an average PWM from individual fan PWM speed settings may allow a PWM duty cycle to airflow relationship. During operating conditions that have limited availability of dynamically sensed thermal conditions, such as at startup, during fan failure, during sensor failure, and during baseline cooling, estimated subsystem thermal conditions based upon subsystem power consumption may provide a model for fan speed settings. Generally, fan speed setting control based upon a summation of estimated and/or actual subsystem thermal conditions may allow defined minimum fan speeds for a system-wide constraint with supplemental cooling of critical components based on closed loop feedback.

Figure 3:
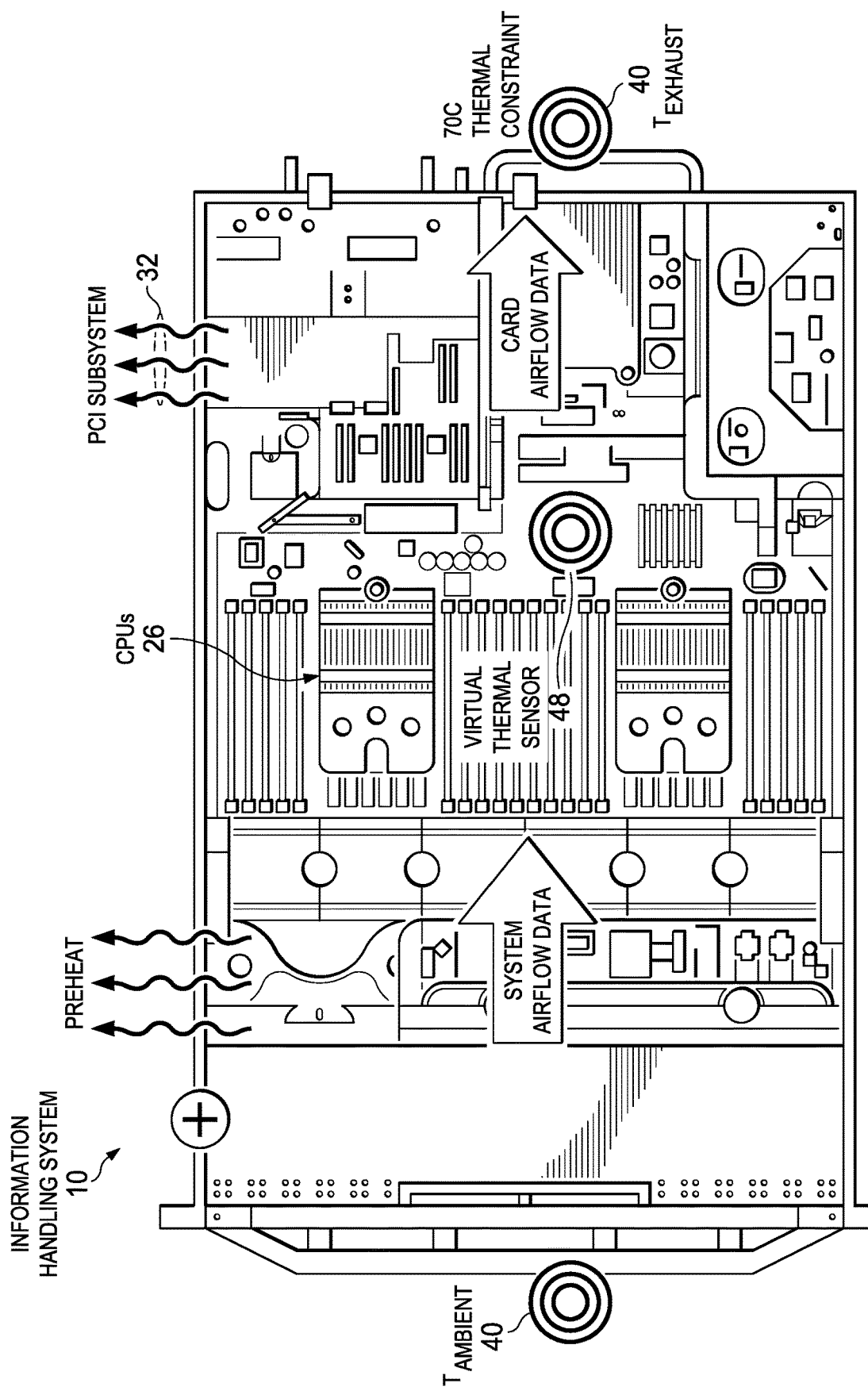
FIG. 3 illustrates a plan view of an example information handling system, in accordance with embodiments of the present disclosure.

FIG. 3 illustrates a plan view of an example information handling system 10, in accordance with embodiments of the present disclosure. External air drawn into information handling system 10 may have an ambient temperature ($T_{AMBIENT}$) measured by an inlet temperature sensor 40 and an airflow rate determined by the speed at which one or more cooling fans spin. As the cooling airflow passes through housing 12, it may absorb thermal energy resulting in a preheat of the airflow for downstream components. The cooling airflow may be forced from information handling system 10 at an exhaust with an exhaust temperature ($T_{EXHAUST}$) fixed at thermal constraint (e.g., 70° C.) as a requirement and/or measured by an exhaust temperature sensor 40. Thermal manager 42 may adapt cooling fan speed so that the cooling airflow temperature $T_{EXHAUST}$ maintains a thermal constraint (e.g., 70° C.)

As shown in FIG. 3, a virtual thermal sensor 48 may be generated by thermal manager 42 at a location in information handling system 10 that receives preheated airflow, such as airflow that has passed by CPUs 26. Thermal manager 42 may apply configuration information stored in BMC 38 to determine the components that preheat airflow to virtual thermal sensor 48 and may determine power consumed by the components to arrive at a virtual temperature measured by virtual thermal sensor 48. For example, thermal manager 42 may apply power consumed by CPUs 26 and static power consumption associated with other preheat components to determine by conservation of energy the ambient temperature of air exhausted from CPUs 26 to arrive at the virtual temperature. The virtual temperature may then be used as an inlet temperature to a PCI card subsystem 32 so that an ambient temperature of PCI card subsystem 32 is computed based upon energy consumed by PCI card subsystem 32. PCI card subsystem 32 may exhaust air at temperature $T_{EXHAUST}$ measured by exhaust sensor 40 so that control of the ambient temperature within PCI card subsystem 32 provides control of the overall system exhaust. The increase in thermal energy caused by PCI card subsystem 32 as reflected by the increase from the virtual temperature to the exhaust temperature may be estimated using conservation of energy applied to the energy consumption of PCI card subsystem 32. Generally, PCI card subsystem 32 power consumption may be measured directly based upon power assigned by a power subsystem or estimated with a static value. Alternatively, power consumption may be derived from estimates using conservation of energy applied to known power consumption and thermal conditions in housing 12. Thus, the power consumed by PCI card subsystem 32 may be dynamically determined by actual measurements of power usage, by stored power usage based on the inventory of the PCI card maintained in the BMC, or by an estimate of power consumption based upon characteristics of the PCI card, such as the width of the PCI card.

Having one or more intermediate virtual thermal sensors 48 may provide flexibility in managing system operation by using a virtual temperature measurement as a dynamic thermal control input or a static thermal control constraint. For example, if PCI card subsystem 32 is controlled to have a static value of 50° C., then fan speed and CPU power consumptions may be adjusted to maintain that value. If $T_{EXHAUST}$ has a constraint of 70° C., then excessive temperatures might occur during low CPU power usage due to low fan speed settings needed to maintain the 50° C. virtual thermal sensor 48 measurement and temperature increases of greater than 20° C. from PCI card power consumption. In such an instance, if precise power control is available for desired components, thermal control might focus on $T_{EXHAUST}$ so that the virtual temperature falls below 50° C. or might focus on power consumption by PCI card subsystem 32 so that less thermal energy is released after virtual thermal sensor 48. Typically, PCI card subsystems do not at this time allow control of thermal energy release, such as by throttling a processor clock, however, such capabilities may be introduced for PCI cards or other components in the future. Discrete control of thermal conditions at different locations within information handling system 10 may be provided by generating virtual thermal sensors at the desired locations and then selectively treating the values as dynamic or static for control purposes.

FIG. 4 illustrates a user interface for managing thermal conditions of a server information handling system with stored configuration settings of subsystems within the information handling system, in accordance with embodiments of the present disclosure. Energy balance table 50 may include energy balance parameters for components integral to information handing system 10 as well as estimated values for potential replacement components, such as non-specific PCI cards having a width of four or eight lanes. By including configuration match information that relates components to energy consumption, thermal manager 42 may be able to estimate a thermal condition based on detected components and energy balance information associated with such detected components as set forth in energy balance table 50.

FIGS. 5A and 5B illustrate a user interface for estimating system airflow and exhaust temperature based upon conservation of energy within an information handling system housing, in accordance with embodiments of the present disclosure. An exhaust temperature energy balance table 52 may apply power, cubic airflow, linear airflow velocity, and sensed temperature values to estimate thermal states and set control for desired cubic airflow, linear airflow velocity, and temperature parameters. A power window 54 may depict a power dissipation calculation performed for each subsystem having an energy balance number in energy balance table 50. A total system power dissipation may represent power use by all desired components, which in this example embodiment may include one or more cooling fans. Scaling factors may be set to adjust the relative power consumption in various configuration modes in response to dynamic power settings. A static power setting may also allow control to achieve a desired power setting at a component. A cubic airflow window 56 depicts a mass flow calculation in cubic feet per minute (CFM) and a linear airflow velocity window 57 depicts a linear airflow velocity in linear feet per minute (LFM) for determination of cubic airflow or linear airflow velocity to achieve the energy balance with the determined power settings for each component. The example embodiment depicted by FIGS. 5A and 5B may estimate cubic airflow, linear airflow velocity, and exhaust temperatures, with virtual temperature sensors. In particular, for a given PWM value associated with cooling fans, exhaust temperature energy balance table 52 may correlate such PWM value to an estimated cubic airflow (e.g., in CFM) and/or an estimated linear airflow velocity (e.g., in LFM) for configurations associated with the energy balance number.

Figure 7:
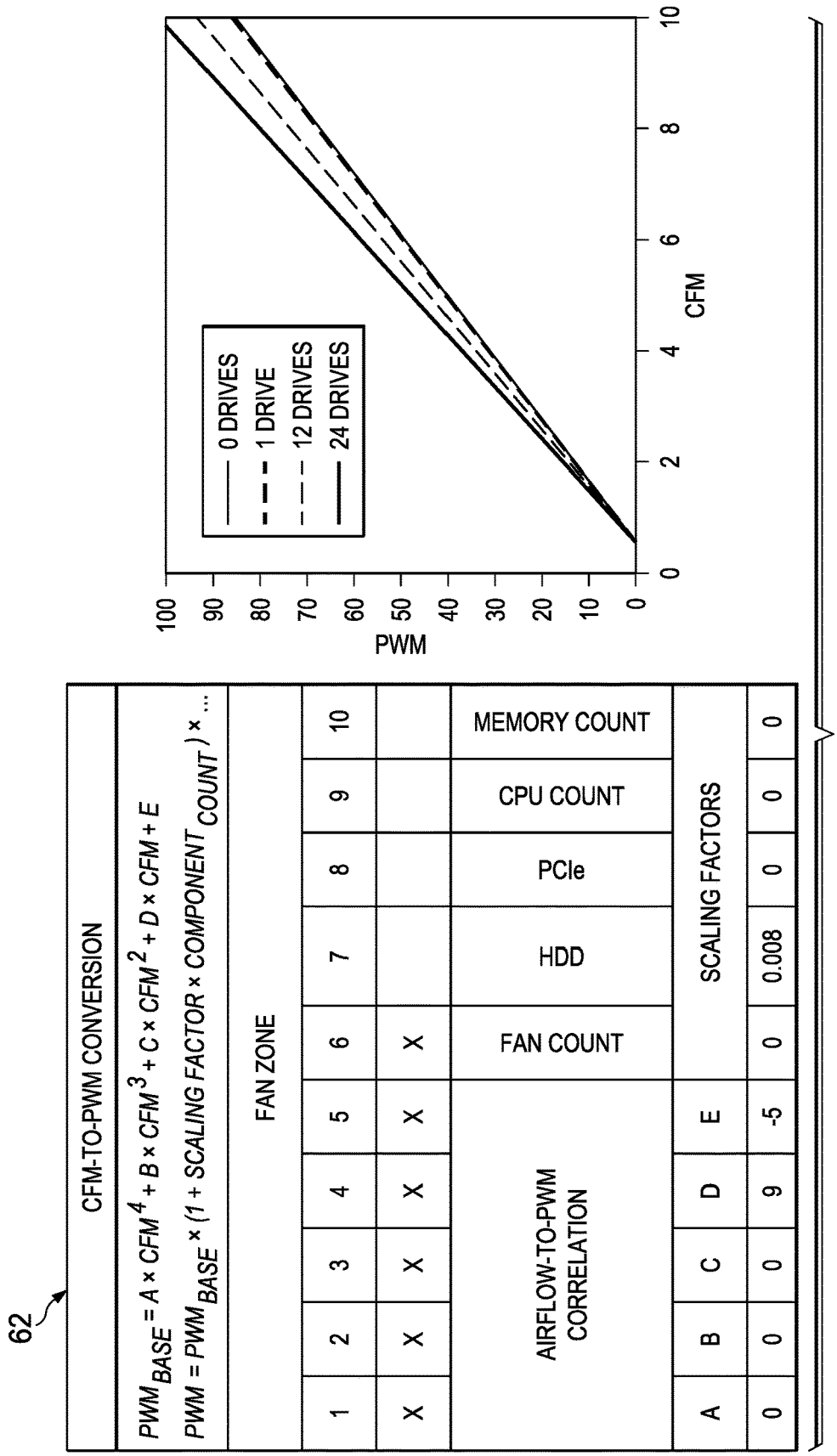
FIG. 7 illustrates a conversion of determined airflow rates to cooling fan pulse width modulation settings, in accordance with embodiments of the present disclosure.

Although FIG. 5B shows estimation of linear airflow velocity based on correlation from PWM values, in some embodiments, linear airflow velocity may be determined from the PWM-to-cubic airflow rate correlation, by dividing the cubic airflow rate correlated to a PWM value by an inlet area of a component of interest (e.g., card). FIG. 7 described below may provide mass airflows converted to cooling fan PWM values to assign cooling fan rotation speeds based upon individual component configurations adjusted for scaling.

Figure 6:
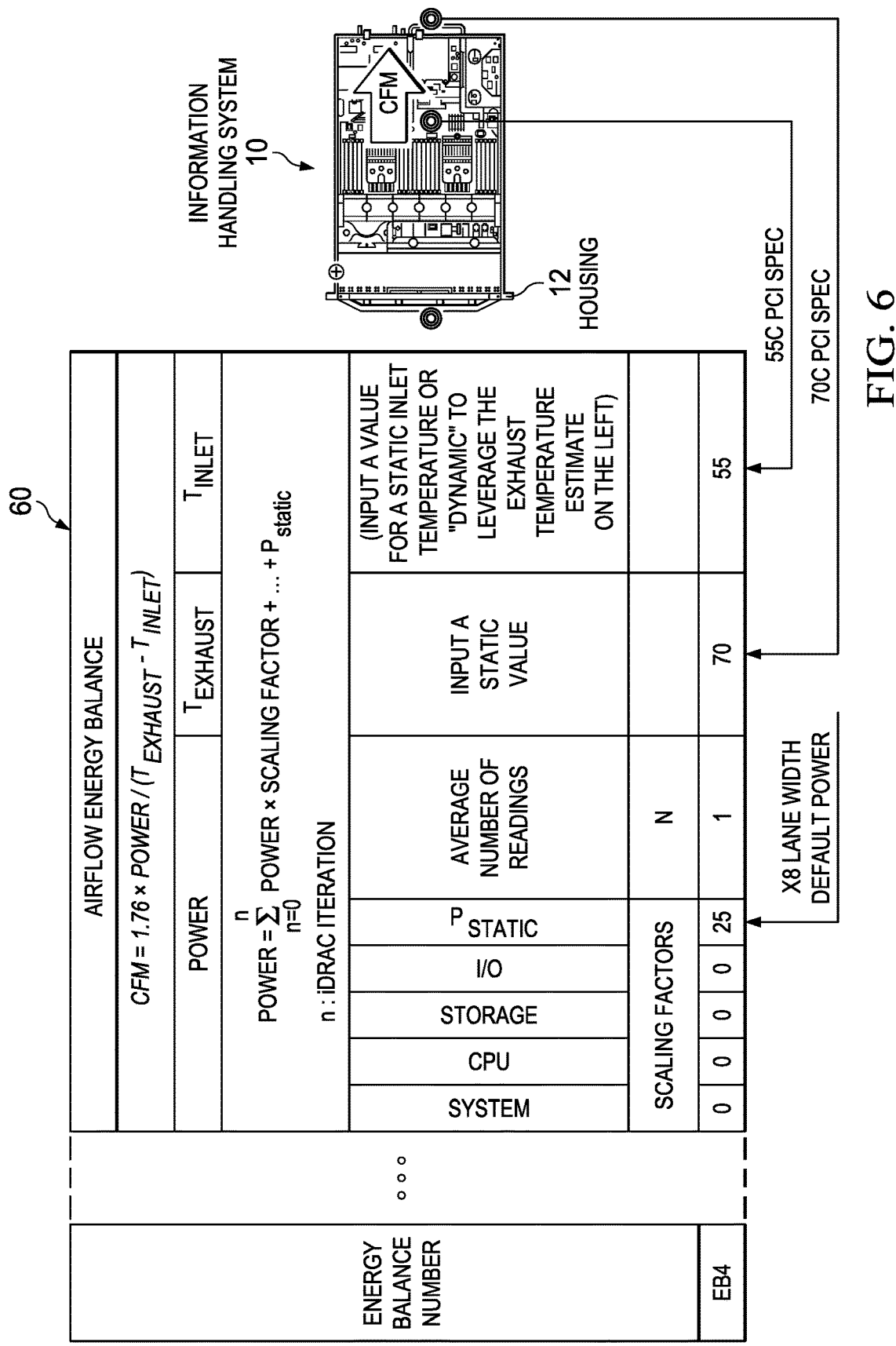
FIG. 6 illustrates a user interface for setting cooling airflow to meet defined conditions, such as temperature defined as a fixed requirement, a measurement read from a sensor, or a measurement leveraged from a virtual sensor reading, in accordance with embodiments of the present disclosure.

FIG. 6 illustrates a user interface for setting cooling airflow to meet defined conditions, such as temperature defined as a fixed requirement, a measurement read from a sensor, or a measurement leveraged from a virtual sensor reading, in accordance with embodiments of the present disclosure. The user interface of FIG. 6 may be used by thermal manager 42 to compute how much airflow is required to cool a component. The temperature and power values may be static or dynamic; however, one value may be set to static to support control of the other values to meet a targeted static condition. An airflow energy balance table 60 may support mass airflow and exhaust temperature estimates with dynamic or static settings in the power consumption of the components. An average number of readings input aids in adjusting for thermal lag related to delays between dissipation of power by components and temperature impacts. In the entry for energy balance number EB4 shown in FIG. 6, an exhaust temperature of 70° C. may be set for exhaust from a PCI card based upon a static power setting for a lane width of eight lanes. For example, a lane width of eight lanes may define an estimated power consumption for the card and the 70° C. temperature may define an overall system safety constraint. The entry sets a static inlet temperature for the PCI card of 55° C., such as might be an input limit for the PCI card or so that an airflow rate is determined that maintains the desired exhaust temperature constraint. Alternatively, the inlet temperature may be dynamic from a physical sensor or from a virtual sensor computed with a conservation of energy estimate based upon upstream component power consumption. If the airflow rate is less than another airflow rate required at a different location in housing 12, the constraint may be met without applying the determined airflow rate. For example, if the airflow rate to maintain 55° C. exhaust from the CPUs is greater than the airflow rate required to maintain PCI card thermal conditions, then the CPU airflow rate will apply. In this manner, discrete airflow rates for different portions of information handling system 10 may provide more exact thermal management for components disposed within housing 12.

FIG. 7 illustrates a user interface table 62 for conversion of determined airflow rates to cooling fan pulse width modulation (PWM) settings, in accordance with embodiments of the present disclosure. For example, a graph of different levels of cooling airflow and PWM settings is depicted for different numbers of hard disk drives disposed in housing 12. Such data may be used to set a scaling factor (value of 0.008 under the heading "HDD") in an energy balance entry for a particular energy balance number. Thus, given a particular airflow requirement, whether in CFM or LFM, required cooling fan speeds may be calculated based upon system configuration as detected by BMC 38.

Using the foregoing methods and systems, a cubic airflow rate or linear airflow velocity at a particular point (e.g., at an inlet of PCI subsystem 32) in information handling system 10 may be estimated based on cooling fan speed. Such cubic airflow rate or linear airflow rate may be a "bulk" or average value (e.g., a per PCI slot average value) or a worst case rate (e.g., a value for a "worst case" PCI slot PCI subsystem 32). In addition, using the foregoing methods and systems, given a required cubic airflow rate or linear airflow velocity for a component (e.g., a PCI card), a minimum fan speed required to support such component may be estimated.

While the foregoing description contemplates using energy balances to estimate a linear airflow velocity in LFM based on a cooling fan PWM value, linear airflow velocity in LFM may also be estimated by using an estimate of cubic airflow rate in CFM (e.g., generated using energy balance data from table 52 in FIGS. 5A and 5B) and an estimated cross-sectional area through which the flow of air travels.

Figure 8:
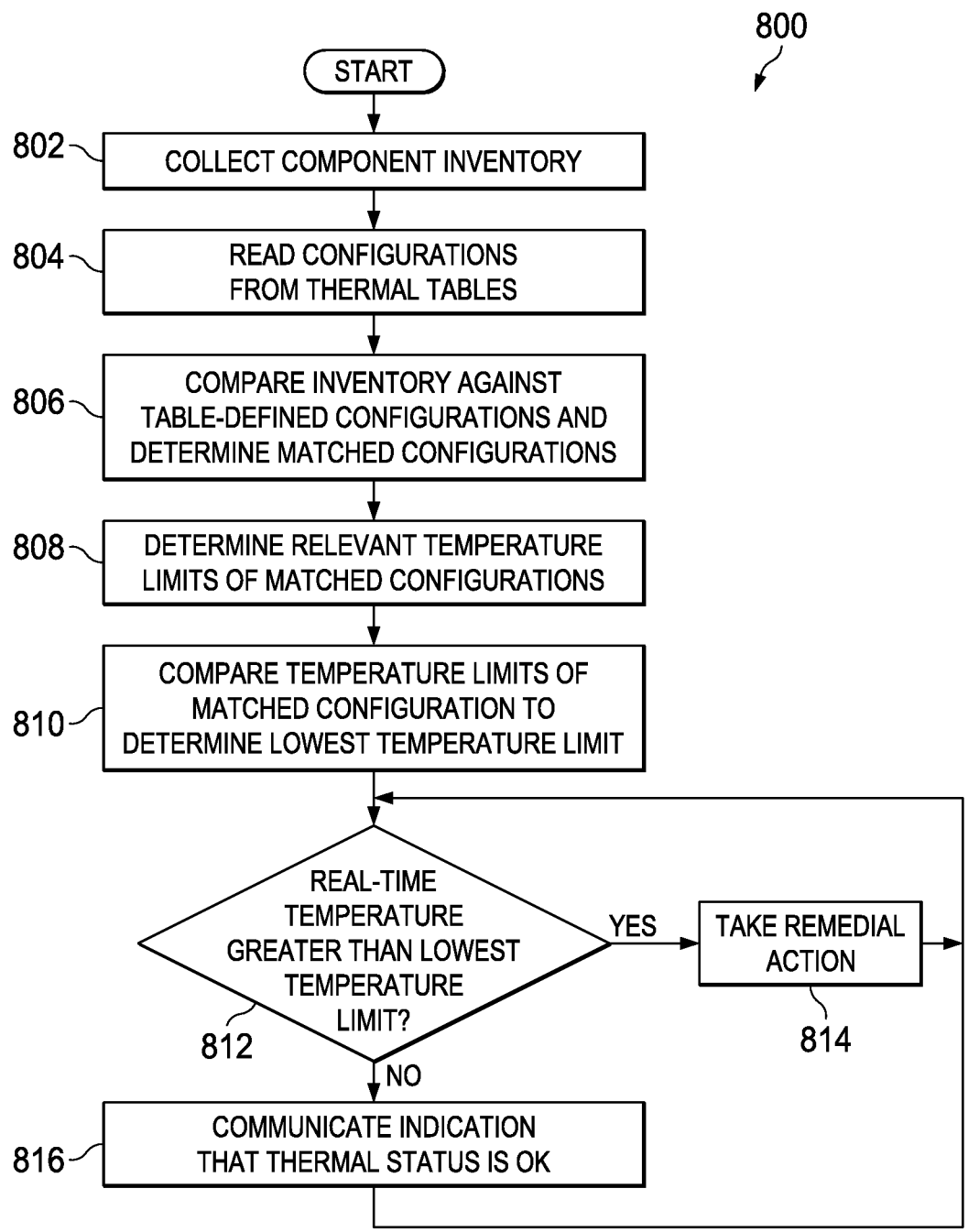
FIG. 8 illustrates a flow chart of an example method for automatically determining configuration restrictions, in accordance with embodiments of the present disclosure.

FIG. 8 illustrates a flow chart of an example method 800 for automatically determining configuration restrictions, in accordance with embodiments of the present disclosure. According to some embodiments, method 800 may begin at step 802. As noted above, teachings of the present disclosure may be implemented in a variety of configurations of information handling system 10. As such, the preferred initialization point for method 800 and the order of the steps comprising method 800 may depend on the implementation chosen.

At step 802, thermal manager 42 may collect a component inventory, such as a component inventory maintained by BMC 38. At step 804, thermal manager 42 may read configurations from thermal tables, such as those configurations set forth in FIGS. 4-6. At step 806, thermal manager 42 may compare the inventory against the table-defined configurations and determine the matched configurations in which table-defined configurations matches the inventory.

At step 808, thermal manager 42 may, for each of all of the matched configurations, determine relevant temperature limits (e.g., ambient temperature limits, exhaust temperature limits, etc.) of the various configurations. At step 810, thermal manager 42 may compare the temperature limits of the various configurations to determine the lowest temperature limit.

At step 812, thermal manager 42 may compare a real-time temperature (e.g., as sensed by a temperature sensor 40) against the lowest temperature limit. If the real-time temperature is greater than the lowest temperature limit, method 800 may proceed to step 814. Otherwise, if the real-time temperature is lower than the lowest temperature limit, method 800 may proceed to step 816.

At step 814, in response to the real-time temperature exceeding the lowest temperature limit, thermal manager 42 may communicate a status warning to a user of information handling system 10 or take another remedial action (e.g., power throttle components of information handling system 10). After completion of step 814, method 800 may proceed again to step 812.

At step 816, in response to the real-time temperature being lower than the lowest temperature limit, thermal manager 42 may communicate a status of "OK" or other indication of absence of a temperature fault to a user of information handling system 10. After completion of step 814, method 800 may proceed again to step 812.

Although FIG. 8 discloses a particular number of steps to be taken with respect to method 800, method 800 may be executed with greater or fewer steps than those depicted in FIG. 8. In addition, although FIG. 8 discloses a certain order of steps to be taken with respect to method 800, the steps comprising method 800 may be completed in any suitable order.

Method 800 may be implemented using one or more information handling systems 10, components thereof, and/ or any other system operable to implement method 800. In certain embodiments, method 800 may be implemented partially or fully in software and/or firmware embodied in computer-readable media.

Figure 9:
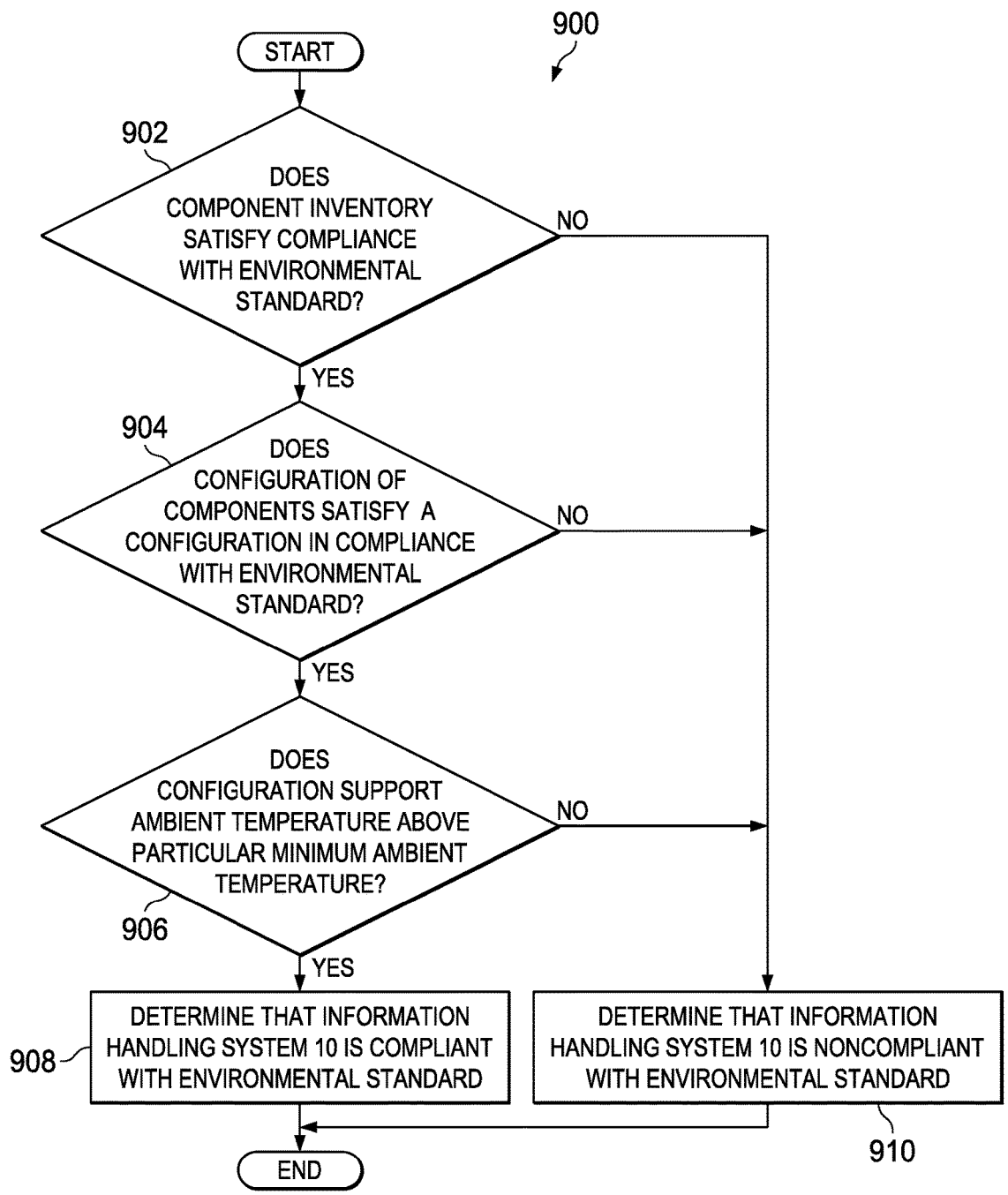
FIG. 9 illustrates a flow chart of an example method for automatically determining compliance with an environmental standard, in accordance with embodiments of the present disclosure.

FIG. 9 illustrates a flow chart of an example method 900 for automatically determining compliance with an environmental standard, in accordance with embodiments of the present disclosure. As used herein "environmental standard" comprises any promulgated standard relating to thermal control of an information handling system, including without limitation Fresh Air compliance, compliance standards of a regulatory agency of a jurisdiction, or standards issued by an industry trade group (e.g., American Society of Heating, Refrigerating and Air-Conditioning Engineers or "ASHRAE). According to some embodiments, method 900 may begin at step 902. As noted above, teachings of the present disclosure may be implemented in a variety of configurations of information handling system 10. As such, the preferred initialization point for method 900 and the order of the steps comprising method 900 may depend on the implementation chosen.

At step 902, thermal manager 42 may determine if a component inventory of information handling system 10 satisfies one or more conditions for compliance with an environmental standard. For example, FIG. 10 illustrates a list of conditions for a component inventory such that satisfaction of at least a defined subset (e.g., one or more) of the listed conditions satisfies a particular environmental standard (e.g., Fresh Air compliance). If the component inventory does not satisfy the environmental standard, method 900 may proceed to step 910. Otherwise, if the component inventory does satisfy the environmental standard, method 900 may proceed to step 904.

At step 904, thermal manager 42 may determine if the configuration of components satisfies a configuration (e.g., as set forth in the tables of FIGS. 4-6 or thermal tables similar thereto) that is in compliance with the environmental standard. If the configuration is not in compliance with the environmental standard, method 900 may proceed to step 910. Otherwise, if the configuration is in compliance with the environmental standard, method 900 may proceed to step 906.

At step 906, thermal manager 42 may determine if a hardware configuration of information handling system 10 (e.g., a number and type of air movers present in information handling system 10) supports an ambient temperature above a particular minimum ambient temperature (e.g., standard room temperature). In some embodiments, the ambient temperature may be determined in accordance with method 800, above. If the ambient temperature is below the particular minimum ambient temperature, method 900 may proceed to step 910. Otherwise, if the ambient temperature is above the particular minimum ambient temperature, method 900 may proceed to step 908.

At step 908, in response to all of the conditions for the environmental standard being satisfied, thermal manager 42 may determine that information handling system 10 is compliant with the environmental standard, and communicate an indication to a user of information handling system 10 of such compliance. After completion of step 908, method 900 may end.

At step 910, in response to one or more of the conditions for the environmental standard not being satisfied, thermal manager 42 may determine that information handling system 10 is not compliant with the environmental standard, and communicate an indication to a user of information handling system 10 of such noncompliance. After completion of step 908, method 900 may end.

Although FIG. 9 discloses a particular number of steps to be taken with respect to method 900, method 900 may be executed with greater or fewer steps than those depicted in FIG. 9. In addition, although FIG. 9 discloses a certain order of steps to be taken with respect to method 900, the steps comprising method 900 may be completed in any suitable order.

Method 900 may be implemented using one or more information handling systems 10, components thereof, and/or any other system operable to implement method 900. In certain embodiments, method 900 may be implemented partially or fully in software and/or firmware embodied in computer-readable media.

Although the foregoing discusses cubic airflow in terms of cubic feet per minute, other units of measurement may be used (e.g., cubic meters per second). Also, although the foregoing discusses linear airflow velocity in terms of linear feet per minute, other units of measurement may be used (e.g., meters per second).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
   a cooling subsystem comprising at least one air mover configured to generate a cooling airflow in the system; and
   a thermal manager communicatively coupled to the cooling subsystem for control of the cooling subsystem and configured to:
   read a list of potential hardware configurations set forth in a thermal table accessible to the thermal manager;
   determine a plurality of hardware configurations based on a comparison of a hardware inventory of the system with the list of potential hardware configurations, such that the hardware inventory of the system matches each of the hardware configurations;
   determine relevant high-temperature limits of each of the plurality of hardware configurations;
   determine the lowest high-temperature limit of the relevant high-temperature limits; and
   responsive to a determination that a real-time temperature is above the lowest high-temperature limit, take remedial action.

2. The system of claim 1, wherein the relevant high-temperature limits of each of the plurality of hardware configurations comprises ambient high-temperature limits associated with each of the plurality of hardware configurations.

3. The system of claim 1, wherein the thermal manager is further configured to determine whether the system satisfies an environmental standard based on the lowest high-temperature limit.

4. The system of claim 3, wherein the thermal manager is further configured to determine whether the system satisfies the environmental standard based further on satisfaction by the hardware inventory and a configuration of the hardware inventory of one or more conditions of compliance with the environmental standard.

5. The system of claim 1, wherein the remedial action comprises at least one of communicating a warning to a user of the system and power throttling one or more components of the system.

6. A method comprising:
   reading a list of potential hardware configurations set forth in a thermal table;
   determining a plurality of hardware configurations based on a comparison of a hardware inventory of a system with the list of potential hardware configurations, such that the hardware inventory of the system matches each of the hardware configurations;
   determining relevant high-temperature limits of each of the plurality of hardware configurations;
   determining the lowest high-temperature limit of the relevant high-temperature limits; and
   responsive to a determination that a real-time temperature is above the lowest high-temperature limit, taking remedial action.

7. The method of claim 6, wherein the relevant high-temperature limits of each of the plurality of hardware configurations comprises ambient high-temperature limits associated with each of the plurality of hardware configurations.

8. The method of claim 6, further comprising determining whether the system satisfies an environmental standard based on the lowest high-temperature limit.

9. The method of claim 8, wherein determining whether the system satisfies the environmental standard includes determining whether the environmental standard is satisfied based further on satisfaction by the hardware inventory and a configuration of the hardware inventory of one or more conditions of compliance with the environmental standard.

10. The method of claim 6, wherein the remedial action comprises at least one of communicating a warning to a user of the system and power throttling one or more components of the system.

11. A system comprising:
    a cooling subsystem comprising at least one air mover configured to generate a cooling airflow in the system; and
    a thermal manager communicatively coupled to the cooling subsystem for control of the cooling subsystem and configured to:
    read a list of potential hardware configurations set forth in a thermal table accessible to the thermal manager;
    determine a plurality of hardware configurations based on a comparison of a hardware inventory of the system with the list of potential hardware configurations, such that the hardware inventory of the system matches each of the hardware configurations;

determine a high-temperature limit associated with the system based on the plurality of hardware configurations; and determine whether the system satisfies an environmental standard based on a lowest high-temperature limit.

12. The system of claim 11, wherein the high-temperature limit comprises an ambient high-temperature limit associated with the system.

13. The system of claim 11, wherein the thermal manager is further configured to determine whether the system satisfies the environmental standard based further on satisfaction by a hardware inventory of the system and a configuration of the hardware inventory of one or more conditions of compliance with the environmental standard.

14. A method comprising:

reading a list of potential hardware configurations set forth in a thermal table accessible to a system having a cooling subsystem comprising at least one air mover configured to generate a cooling airflow in the system and a thermal manager communicatively coupled to the cooling subsystem for control of the cooling subsystem;

determining a plurality of hardware configurations based on a comparison of a hardware inventory of the system with the list of potential hardware configurations, such that the hardware inventory of the system matches each of the hardware configurations;

determining a high-temperature limit associated with the system based on the plurality of hardware configurations; and determining whether the system satisfies an environmental standard based on a lowest high-temperature limit.

15. The method of claim 14, wherein the high-temperature limit comprises an ambient high-temperature limit associated with the system.

16. The method of claim 14, wherein determining whether the system satisfies the environmental standard includes determining whether the environmental standard is satisfied based further on satisfaction by a hardware inventory of the system and a configuration of the hardware inventory of one or more conditions of compliance with the environmental standard.

* * * * *